United States Patent [19]

Doyle

[11] Patent Number: 5,834,355
[45] Date of Patent: Nov. 10, 1998

[54] METHOD FOR IMPLANTING HALO STRUCTURES USING REMOVABLE SPACER

[75] Inventor: Brian S. Doyle, Cupertino, Calif.

[73] Assignee: Intel Corporation, Santa Clara, Calif.

[21] Appl. No.: 778,017

[22] Filed: Dec. 31, 1996

[51] Int. Cl.$^6$ .......................... H01L 21/336; H01L 21/31
[52] U.S. Cl. .......................... 438/305; 423/773; 423/960
[58] Field of Search .................................. 438/301, 303, 438/305, 773, 960

[56] References Cited

U.S. PATENT DOCUMENTS

| | | | |
|---|---|---|---|
| 5,166,087 | 11/1992 | Kakimoto et al. | 437/44 |
| 5,364,807 | 11/1994 | Hwang | 437/44 |
| 5,422,506 | 6/1995 | Zamapian | 257/344 |
| 5,427,964 | 6/1995 | Kaneshiro et al. | 437/41 |
| 5,580,804 | 12/1996 | Joh | 437/41 |
| 5,595,919 | 1/1997 | Pan | 437/29 |
| 5,659,504 | 8/1997 | Bude et al. | 365/185.27 |
| 5,675,166 | 10/1997 | Ilderem et al. | 257/345 |
| 5,736,446 | 4/1998 | Wu | 438/305 |

*Primary Examiner*—David Graybill
*Assistant Examiner*—Michael S. Lebentritt
*Attorney, Agent, or Firm*—Blakely, Sokoloff, Taylor & Zafman

[57] ABSTRACT

According to one embodiment, the present invention provides a method for implanting halo structures into a transistor that is fabricated on a semiconductor substrate which consists of a silicon layer; a gate dielectric formed on the silicon layer; a polysilicon layer formed on the gate dielectric; and a silicon nitride layer formed over the polysilicon layer. The silicon nitride layer is patterned and removed so that a portion of the polysilicon layer is exposed. A silicon dioxide layer is then deposited over the silicon nitride layer. Next, the silicon dioxide layer is etched so that a dioxide spacer is formed on the sidewall of the silicon nitride layer. The silicon nitride layer is removed. A silicon nitride layer is deposited over the polysilicon layer and the dioxide spacer. The silicon nitride layer is etched so that nitride spacers are formed on the sidewalls of the dioxide spacer. Next, a photoresist layer is deposited over the exposed regions of the polysilicon layer, the dioxide spacer, and nitride spacers. The photoresist layer is then planarized. The nitride spacers are removed. The exposed portion of the polysilicon layer is removed. The exposed portion of the polysilicon layer is the portion previously covered by the nitride spacers. Next, halo structures are implanted into the exposed sections of the silicon layer. The photoresist layer is removed so that the polysilicon layer is exposed. The exposed portion of the polysilicon layer is then removed. The exposed portion of the polysilicon layer is the portion not covered by the dioxide spacer. The exposed portion of the gate dielectric is removed. The exposed portion of the gate dielectric layer is the portion not covered by the dioxide spacer. Finally, the dioxide spacer is removed.

22 Claims, 19 Drawing Sheets

METHOD FOR IMPLANTING HALO STRUCTURES USING REMOVABLE SPACER

FIELD OF THE INVENTION

The present invention relates generally to the area of fabricating semiconductor devices, and more specifically to a method for implanting halo structures into transistors using removable spacers.

BACKGROUND

Since the dawn of the electronic revolution in the 1970's, continuous technological advances in the computer industry have depended upon the speed in which integrated circuits manipulate data. In order to increase the speed of integrated circuits, transistors within each integrated circuit must be made smaller. However, the reduction in the size of a transistor beyond a particular threshold may cause parasitic effects to occur within the transistor.

A typical transistor consists of a gate, source region, and drain region. Between the source and drain regions is a channel region. The channel region, which is controlled by the gate, serves as a barrier to electron charges in the source region. The channel region is considered a barrier because it prevents electrical current from flowing between the source and drain regions when the transistor is in the "OFF" state. Whenever a sufficient voltage is applied to the gate the transistor switches to an "ON" state, causing the barrier to decrease in the channel region. Thus, applying voltage to the gate permits an electrical current flow from the source region to the drain region.

As the size of transistors are made smaller, the channel region of a transistor is reduced; thereby causing the source and drain regions to become closer in proximity. Consequently, as the source and drain regions become closer in proximity the channel region increasingly loses its capacity as a barrier. Once the size of the transistor is reduced to a certain threshold, the gate loses its control of switching the transistor on and off. The lack of control of the gate results in an increase in the probability that leakage current may flow freely from the source region to the drain region despite the condition of the transistor, "ON" or "OFF". This parasitic effect is called Short Channel Effects.

In order to reduce Short Channel Effects, halo structures (or pocket implants) are implanted into the transistor to enable control of the gate. Halo structures are essentially a high concentration of dopants that are implanted to raise the gate barrier, thus, making it more difficult for current to leak from the source region to the drain region. It is necessary to maintain the halo structure dopants in a tight region to provide greater control of the transistor, and minimize junction capacitance. Junction capacitance is a magnitude of capacitance within the transistor which may be substantially increased if dopants diffuse out of the region of interest. As the junction capacitance increases, the propagation delay within the transistor also increases. Therefore, an increase in junction capacitance reduces the speed of the transistor, which in turn diminishes the performance of the transistor.

FIG. 1a illustrates a semiconductor substrate 5, which is to be fabricated into a transistor. Semiconductor substrate 5 includes a substrate 10, and a polysilicon layer 15 which completely covers substrate 10. The first step in the process entails polysilicon layer 15 being etched to form gate 20, as illustrated in FIG. 1b. FIG. 1c shows semiconductor substrate 5 after dopants are implanted to form shallow junctions just under the surface of substrate 10, adjacent to both sides of gate 20. A silicon nitride layer 25 is then formed over substrate 10 and gate 20 (FIG. 1d). One skilled in the art will appreciate that a silicon dioxide layer 25 could be formed over substrate 10 and gate 20 as a substitute for silicon nitride layer 25. Next, silicon nitride layer 25 is etched to form spacers 30, as illustrated in FIG. 1e. Spacers 30 are formed on the sidewalls of gate 20, and cover the shallow junction areas of substrate 10. Subsequently, more dopants are implanted into the exposed regions of substrate 10 in order to form deep junctions. Consequently, substrate 10 is transformed into a source region 40 and a drain region 50 shown in FIG. 1f.

FIG 1g shows substrate 5 after spacers 30 have been removed. After spacers 30 are removed, halo structures 60 are implanted into substrate 5. Halo structures 60 are implanted into source region 40 and drain region 50, immediately adjacent to gate 20 (FIG. 1h). Substrate 5 may be n-doped (with source region 40 and drain region 50 consisting of $n^+$ ions, while halo structures consist of $p^-$ ions), or $p^+$ doped (with source region 40 and drain region 50 consisting of $p^+$ ions while halo structures consist of $n^-$ ions). It will be obvious to one with ordinary skill in the art that the doping of the source, drain, and halo regions may be made up of a variety of doping patterns. At present, the most common method of implanting halo structures is the Large Angle Tilt Implants (LATIDs). Using the LATID method, the angle of the implant is increased up to 60 degrees from vertical. During the LATID process, the implanted dopants are originally in a non-activated form (i.e., no conductive properties). The halo structures must subsequently be heated in order to give the dopants the desired conductive properties. As illustrated in FIG. 1i, during the heating process the dopants in the halo structures diffuse out of the implant regions such that the halo structures extend beyond the deep junction areas in the source and gate regions. An ideal halo structure does not extend beyond the deep junction areas. The effect of the diffusion of the halo structure dopants is that there will be a loss in controllability in the transistor, as well as an increase in junction capacitance.

Implanting a single halo structure into only one side of the transistor, the source region or drain region, may also reduce parasitic effects. After the step shown in FIG. 1g, in which spacers 30 are removed, a photoresist layer 70 is formed over drain region 50 (FIG. 1j). Using the LATID method, a halo structure 60 is implanted into the source region of substrate 5, immediately adjacent to gate 20 (FIG. 1k). FIG. 1l shows substrate 5 after photoresist layer 70 has been removed. Finally, FIG. 1m illustrates substrate 5 after it is heated to activate the dopants in halo structure 60. Again, this causes the dopants to diffuse throughout source region 40. As described above, the transistor fabricated using the LATID method of implanting halo structure 60 will experience depleted performance due to an increase in junction capacitance and a loss of control Several methods may be used in order to counteract the diffusion of dopants out of the halo structure regions. One method is to provide an extra mask during the process of manufacturing the transistor in order to screen most of the junction region. After the step shown in FIG. 1g, in which spacers 30 are removed, a photoresist layer 70 is formed over the deep junction areas of both source region 40 and drain region 50 (FIG. 1n). Next, halo structures 60 are implanted into the shallow junction areas of source region 40 and drain region 50, as shown in FIG. 1o. As illustrated in FIG. 1p, during the heating process the dopants in the halo structures diffuse out of the implant regions. Finally, photoresist layer 70 is removed, as shown in FIG. 1p. It is apparent that with the use of photoresist layer 70 that halo structures 60 do not extend beyond the deep junction areas. However, adding an extra mask may substantially increase the time and expense of manufacturing the transistor. Also, alignment problems may occur in which some of the deep junction areas may not be covered by the mask. If alignment problems occur, the halo structures may not be limited to the shallow junction regions as shown in FIG. 1o. Thus, dopants from the halo structures may diffuse out of the implant areas after the substrate is heated, as shown in FIG. 1i.

Another method of reducing the diffusion of dopants out of the halo structure implant regions is to limit the depth of the implant to below the deep junction. In this method, halo structures are implanted in a shallow area just below the substrate. However, this process must be carefully controlled so as to reduce variations in the implanting of the halo structures. Yet another method of reducing diffusion is to control the temperature during the heating process. Incremental temperature steps may be applied during the heating process in order to reduce the diffusion of the dopants from the implant regions. Nevertheless, it would be desirable to have the capability of implanting halo structures without needing such tight control of implant energy. Controlling temperature while implanting halo structures is an intricate process which is often expensive. Therefore, an efficient method for controlling the implanting of halo structures for the purpose of reducing Short Channel Effects is required.

The present invention uses removable spacers to control the process of implanting halo structures. A method of controlling the implanting of halo structures using removable spacers permits a tight control of dopants within the implant region, thereby eliminating the diffusion of dopants into other regions of the transistor. The present invention efficiently eliminates Short Channel Effects without diminishing the performance of the transistor due to dopant diffusion

SUMMARY OF THE INVENTION

According to one embodiment, the present invention provides a method for implanting halo structures into a transistor that is fabricated on a semiconductor substrate which consists of a silicon layer; a gate dielectric formed on the silicon layer; a polysilicon layer formed on the gate dielectric; and a silicon nitride layer formed over the polysilicon layer. The silicon nitride layer is patterned and removed so that a portion of the polysilicon layer is exposed. A silicon dioxide layer is then deposited over the silicon nitride layer. Next, the silicon dioxide layer is etched so that a dioxide spacer is formed on the sidewall of the silicon nitride layer. The silicon nitride layer is removed. A silicon nitride layer is deposited over the polysilicon layer and the dioxide spacer. The silicon nitride layer is etched so that nitride spacers are formed on the sidewalls of the dioxide spacer. Next, a photoresist layer is deposited over the exposed regions of the polysilicon layer, the dioxide spacer, and nitride spacers. The photoresist layer is then planarized. The nitride spacers are removed. The exposed portion of the polysilicon layer is removed. The exposed portion of the polysilicon layer is the portion previously covered by the nitride spacers. Next, halo structures are implanted into the exposed sections of the silicon layer. The photoresist layer is removed so that the polysilicon layer is exposed. The exposed portion of the polysilicon layer is then removed. The exposed portion of the polysilicon layer is the portion not covered by the dioxide spacer. The exposed portion of the gate dielectric is removed. The exposed portion of the gate dielectric layer is the portion not covered by the dioxide spacer. Finally, the dioxide spacer is removed.

According to a second embodiment, the present invention provides a method for implanting halo structures into a transistor that is fabricated on a semiconductor substrate which consists of a silicon layer, and a silicon nitride layer formed over the silicon layer. First, the silicon nitride layer is patterned. A silicon dioxide layer is formed over the silicon layer and silicon nitride layer. The silicon dioxide layer is then etched so that a dioxide spacer is formed on the sidewall of the second layer. The silicon nitride layer is removed. A silicon nitride layer is then formed over the dioxide spacer and the remainder of the silicon layer. The silicon nitride layer is then planarized. The dioxide spacer is etched. A silicon dioxide layer is then conformally deposited. The silicon dioxide layer is etched then so that dioxide spacers are aligned on the sidewalls of the silicon nitride layer. Next, a gate dielectric is formed over the exposed portion of the silicon layer. The exposed portion of the silicon layer is between the dioxide spacers. A polysilicon layer is formed over the silicon nitride layer, the gate dielectric, and the dioxide spacers. The polysilicon layer is then planarized. The dioxide spacers are removed. A dioxide layer is formed over the polysilicon layer. The halo structures are implanted. The silicon nitride layer is removed. Finally, the dioxide layer is removed.

According to a third embodiment, the present invention provides a method for implanting halo structures into a transistor that is fabricated on a semiconductor substrate comprising a silicon layer, a gate dielectric formed on the silicon layer, a polysilicon layer formed on the gate dielectric, a silicon dioxide layer formed on the polysilicon layer, a silicon nitride layer formed over the silicon dioxide layer, and a photoresist layer formed over the silicon nitride layer. First, the photoresist layer is patterned so that a portion of the silicon nitride layer is exposed. The exposed portion of the silicon nitride layer is removed. The exposed portion of the silicon dioxide layer is then removed. Next, the photoresist layer is removed. A second silicon nitride layer is then formed over the first silicon nitride layer and the polysilicon layer. The second silicon nitride layer is etched so that a nitride spacer is formed on the sidewall of the silicon dioxide and first silicon nitride layers. A silicon dioxide layer is formed over the polysilicon layer, the silicon nitride layer, and the nitride spacer. The silicon dioxide layer is then etched so that a dioxide spacer is formed on the sidewall of the nitride spacer. Next, a photoresist layer is deposited over the uncovered portion of the polysilicon layer. The photoresist layer is then planarized. The nitride spacer is removed. The silicon nitride layer is removed. The uncovered portion of the polysilicon layer is removed. The uncovered portion of the polysilicon layer is the portion previously covered by the nitride spacer. The uncovered portion of the gate dielectric is removed. A halo structure is implanted. The photoresist layer is removed. The silicon dioxide layer is flashed off. The exposed portion of the polysilicon layer is removed. The exposed portion of the polysilicon layer is the portion not covered by the dioxide spacer. The exposed portion of the gate dielectric is removed. Finally, the dioxide spacer is removed.

BRIEF DESCRIPTION OF THE DRAWINGS

The present invention is illustrated by way of example and not limitation in the figures of the accompanying drawings in which:

FIG. 2i illustrates the semiconductor substrate corresponding to the first embodiment of the present invention after the photoresist layer is planarized.

FIG. 2j illustrates the semiconductor substrate corresponding to the first embodiment of the present invention after the silicon nitride spacers are selectively etched.

FIG. 2k illustrates the semiconductor substrate corresponding to the first embodiment of the present invention after the halo structures are implanted.

FIG. 2l illustrates the semiconductor substrate corresponding to the first embodiment of the present invention after the photoresist layer is removed.

DETAILED DESCRIPTION

Figure 1A:
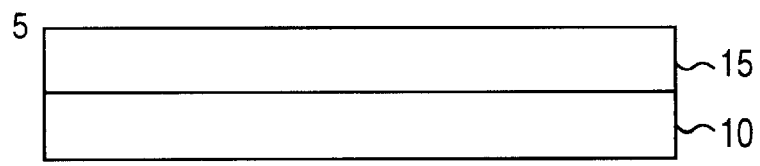
FIG. 1a illustrates a semiconductor substrate to be fabricated into a transistor according to the prior art method of fabricating transistors.
Figure 1B:
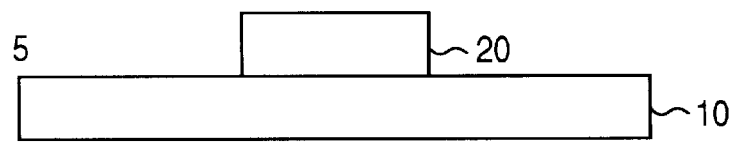
FIG. 1b illustrates a semiconductor substrate to be fabricated into a transistor according to the prior art method of fabricating transistors after the polysilicon layer is etched to form a gate.
Figure 1C:
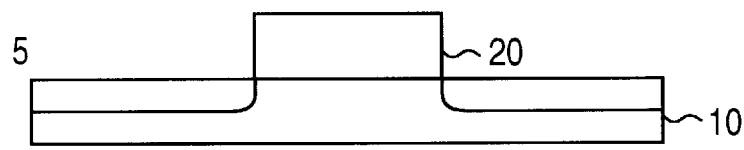
FIG. 1c illustrates a semiconductor substrate to be fabricated into a transistor according to the prior art method of fabricating transistors after dopants are implanted to form the shallow junctions of the substrate.
Figure 1D:
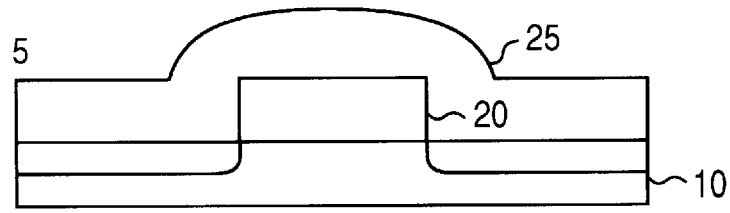
FIG. 1d illustrates a semiconductor substrate to be fabricated into a transistor according to the prior art method of fabricating transistors after the silicon nitride layer is formed.
Figure 1E:
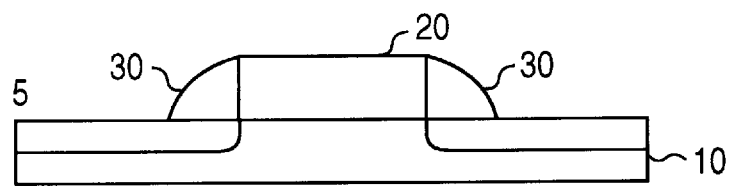
FIG. 1e illustrates a semiconductor substrate to be fabricated into a transistor according to the prior art method of fabricating transistors after the spacers are formed.
Figure 1F:
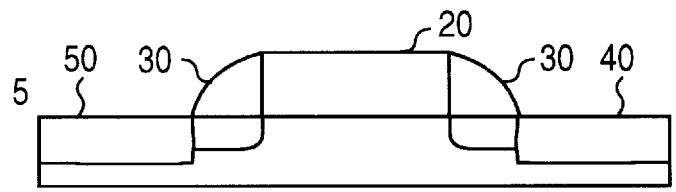
FIG. 1f illustrates a semiconductor substrate to be fabricated into a transistor according to the prior art method of fabricating transistors after the substrate is transformed into a source region and a drain region.
Figure 1G:
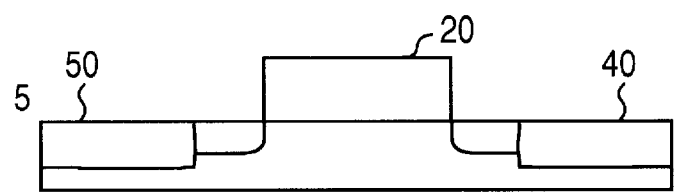
FIG. 1g illustrates a semiconductor substrate to be fabricated into a transistor according to the prior art method of fabricating transistors after the spacers have been removed.
Figure 1H:
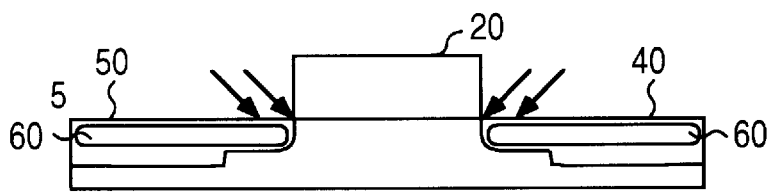
FIG. 1h illustrates a semiconductor substrate to be fabricated into a transistor according to the prior art method of fabricating transistors after halo structures are implanted.
Figure 1I:
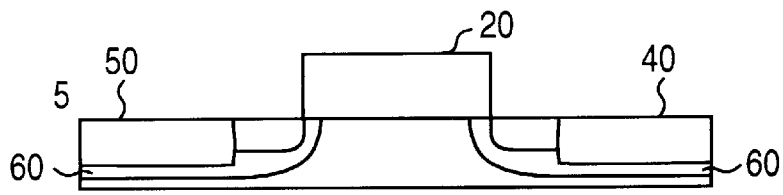
FIG. 1i illustrates a semiconductor substrate to be fabricated into a transistor according to the prior art method of fabricating transistors after the dopants are heated.

Referring to the drawings in detail, wherein like numerals designate like parts and components, the following description sets forth numerous specific details in order to provide a thorough understanding of the present invention. However, after reviewing this specification, it will be apparent to those skilled in the art that the present invention may be practiced without some or all of these specific details. In other instances, well known wafer designs and techniques have not been described in detail in order not to unnecessarily obscure the present invention.

According to a first embodiment, halo structures are implanted into a transistor that is fabricated on a semiconductor substrate in a manner such that a gate is defined in the silicon wafer, and disposable spacers added. A resist layer is then added and planarized to allow the removal of only the spacers. The remaining structure is used as a mask to limit the halo structure to the area immediately adjacent to the gate.

Figure 2A:
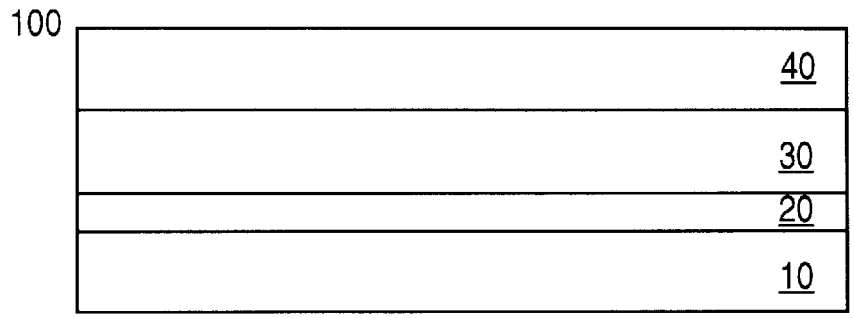
FIG. 2a illustrates a semiconductor substrate corresponding to the first embodiment of the present invention.

FIG. 2a illustrates a semiconductor substrate 100 corresponding to the first embodiment of the present invention. Semiconductor substrate 100 includes a substrate 10, a thin gate dioxide layer 20, a polysilicon layer 30, and a silicon nitride layer 40. Semiconductor substrate 100 is initially configured in a manner such that thin gate dioxide layer 20 is deposited over substrate 10; polysilicon layer 30 is deposited over thin gate dioxide layer 20; and silicon nitride layer 40 is deposited over polysilicon layer 30. Substrate layer 10 may be made up of silicon. However, one skilled in the art will appreciate that other materials and may also be used. Also, one skilled in the art will recognize that any gate dielectric material may be substituted for thin gate dioxide layer 20.

Figure 2B:
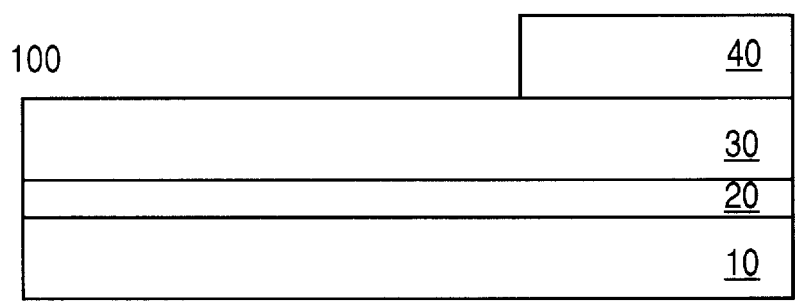
FIG. 2b illustrates the semiconductor substrate corresponding to the first embodiment of the present invention after the silicon nitride layer is patterned and removed.
Figure 2C:
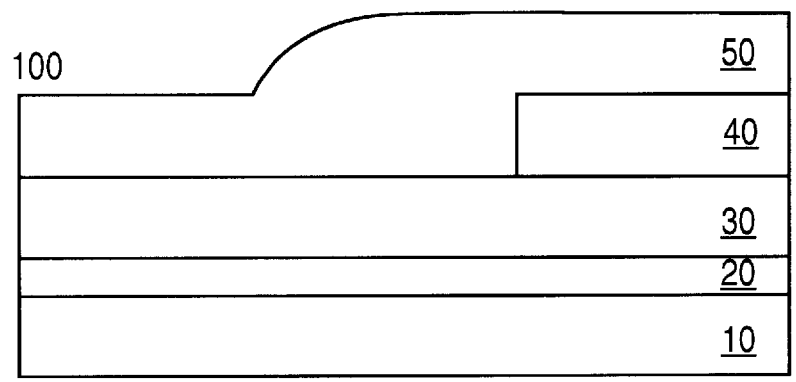
FIG. 2c illustrates the semiconductor substrate corresponding to the first embodiment of the present invention after the silicon dioxide layer is conformally deposited.
Figure 2D:
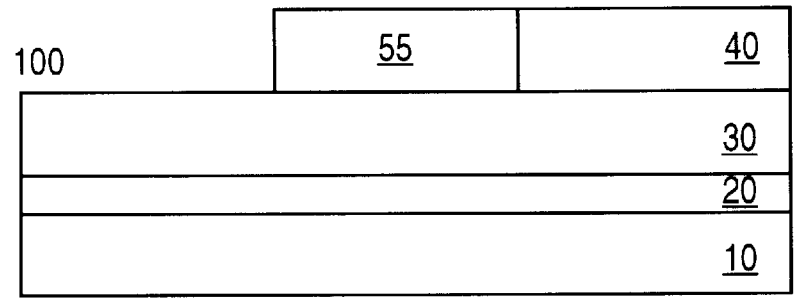
FIG. 2d illustrates the semiconductor substrate corresponding to the first embodiment of the present invention after the dioxide spacer is formed.

Referring to FIG. 2b, silicon nitride layer 40 is patterned and removed. Next, a silicon dioxide layer 50 is conformally deposited over silicon nitride layer 40, as shown in FIG. 2c. One skilled in the art would recognize that silicon nitride and silicon dioxide may be interchanged such that a silicon nitride layer 50 may deposited over a silicon dioxide layer 40. FIG. 2d illustrates semiconductor substrate 100 after silicon dioxide layer 50 is etched anisotropically, leaving a dioxide spacer 55 on the sidewall of silicon nitride layer 40. Silicon nitride layer 40 is stripped off, leaving dioxide spacer 55 as the only layer remaining on polysilicon layer 30. The process performed on wafer 100 in FIGS. 2a–2d is commonly referred to as sidewall etchback techniques.

Figure 2E:
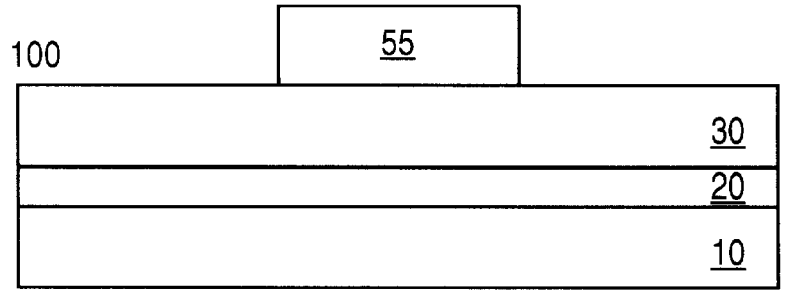
FIG. 2e illustrates the semiconductor substrate corresponding to the first embodiment of the present invention after the silicon nitride layer is stripped off.
Figure 2F:
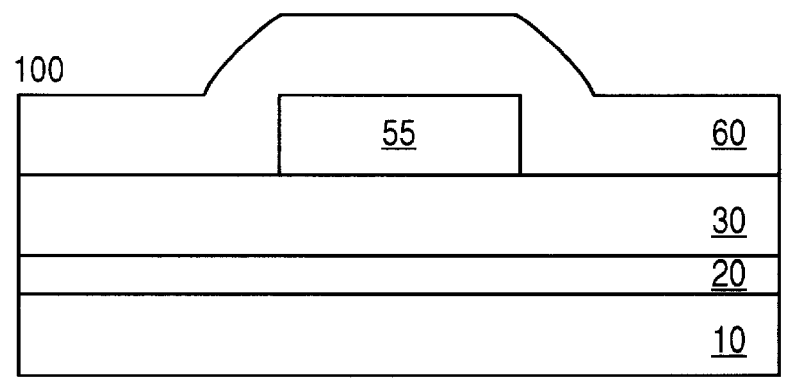
FIG. 2f illustrates the semiconductor substrate corresponding to the first embodiment of the present invention after the second silicon nitride layer is deposited.
Figure 2G:
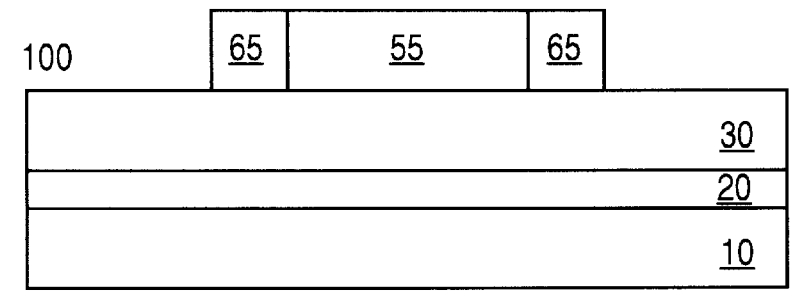
FIG. 2g illustrates the semiconductor substrate corresponding to the first embodiment of the present invention after the nitride spacers are formed.

Now referring to FIG. 2e, semiconductor substrate 100 is illustrated as the result of sidewall etchback techniques having been completed. A second silicon nitride layer 60 is deposited over dioxide spacer 55 and polysilicon layer 30, as shown in FIG. 2f. Next, silicon nitride layer 60 is anisotropically etched leaving nitride spacers 65 on the sidewalls of dioxide spacer 55 (FIG. 2g).

Figure 2H:
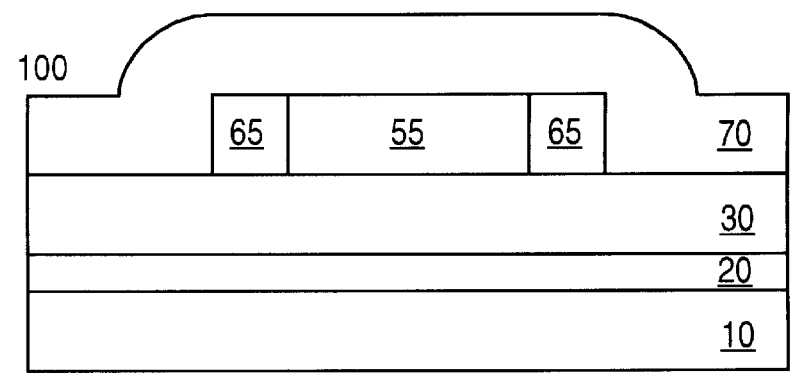
FIG. 2h illustrates the semiconductor substrate corresponding to the first embodiment of the present invention after the photoresist layer is deposited.

Subsequent to silicon nitride spacers 65 being formed, a photoresist layer 70 is deposited over dioxide spacer 55, spacers 65 and the exposed portion of polysilicon layer 30 (FIG. 2h). Photoresist layer 70 is then planarized to form the structure of semiconductor substrate 100 shown in FIG. 2i. Next, silicon nitride spacers 65 are selectively etched such that there is a gap immediately adjacent to either side of dioxide spacer 55. The regions of polysilicon layer 30 which were masked by nitride spacers 65 are also selectively etched, resulting in FIG. 2j.

Figures 2I, 2J, 2K, 2L:
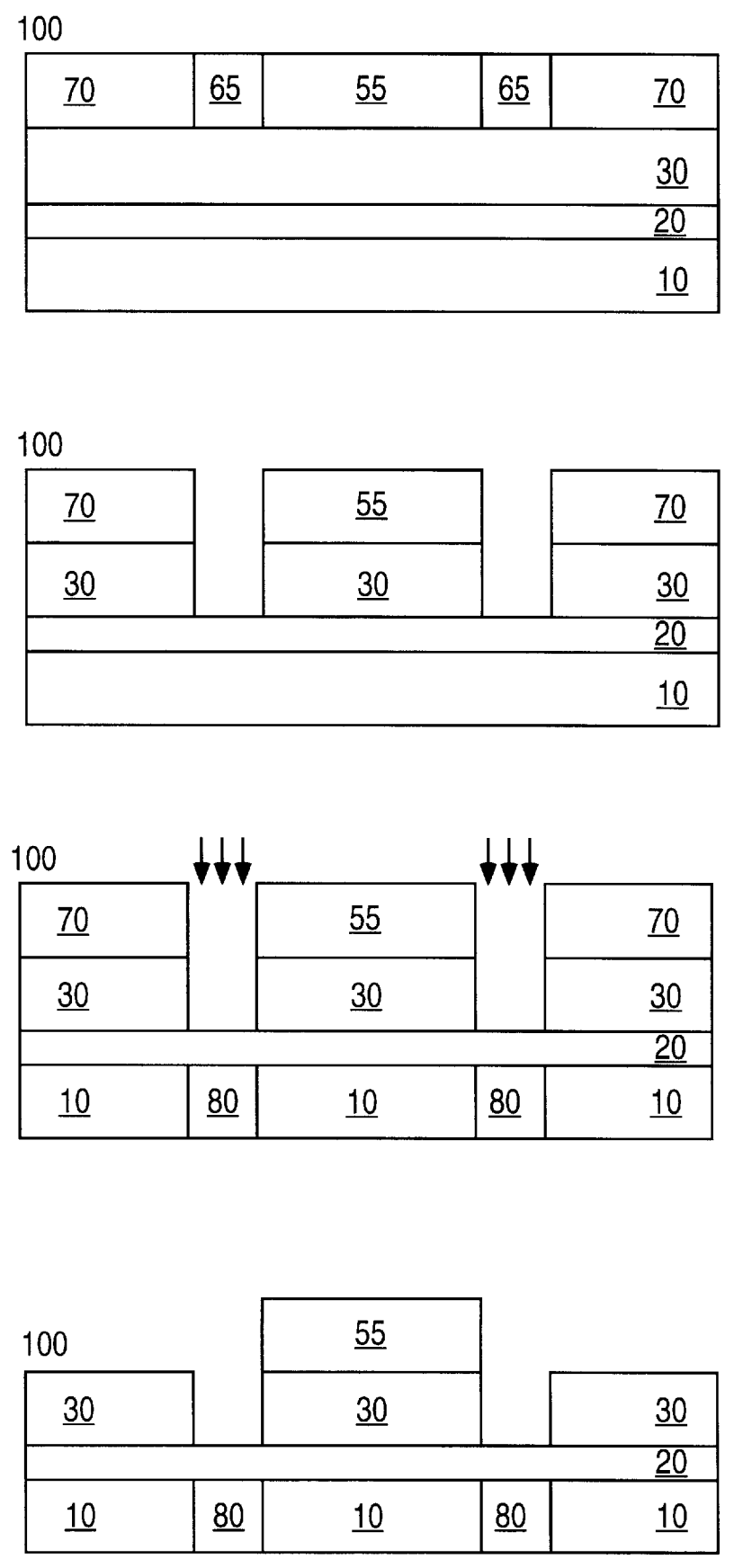
Figure 2M:
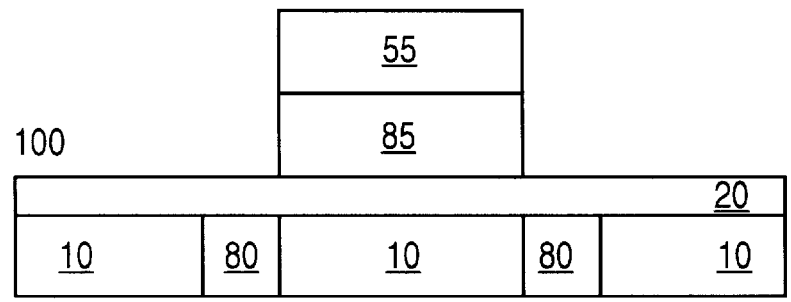
FIG. 2m illustrates the semiconductor substrate corresponding to the first embodiment of the present invention after the polysilicon layer is removed.
Figure 2N:
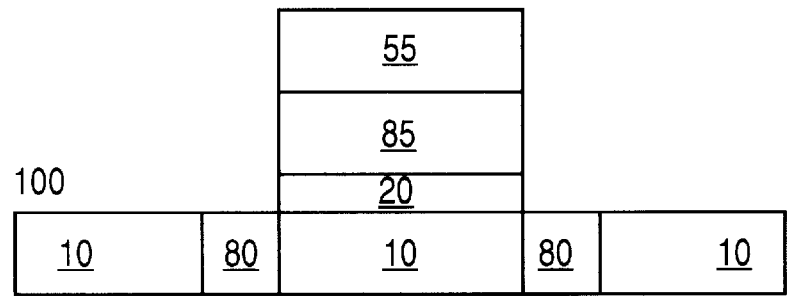
FIG. 2n illustrates the semiconductor substrate corresponding to the first embodiment of the present invention after the thin dioxide layer is removed.

Referring to FIG. 2k, halo structures 80 are implanted into the unmasked regions of substrate 10 immediately adjacent to dioxide spacer 55. The regions in which the halo structures are implanted were previously masked by nitride spacers 65 and the sections of polysilicon layer 30 which were selectively etched. Next, photoresist layer 70 is removed as illustrated in FIG. 2l. The regions of polysilicon layer 30 that are not covered by dioxide spacer 55 is removed (FIG. 2m). The portion of polysilicon layer 30 that remains on semiconductor substrate 100 is polysilicon gate 85, which is the gate of the transistor to be fabricated. The exposed regions of thin dioxide layer 20 are then removed, as shown in FIG. 2n.

Figure 2O:
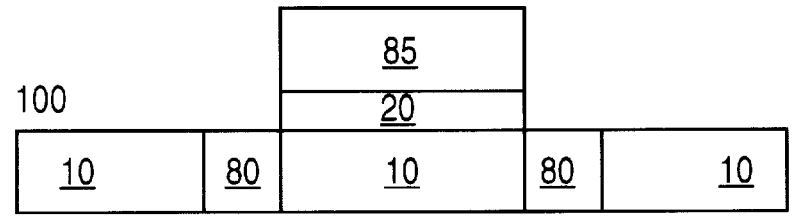
FIG. 2o illustrates the semiconductor substrate corresponding to the first embodiment of the present invention after the dioxide spacer is removed.
Figure 2P:
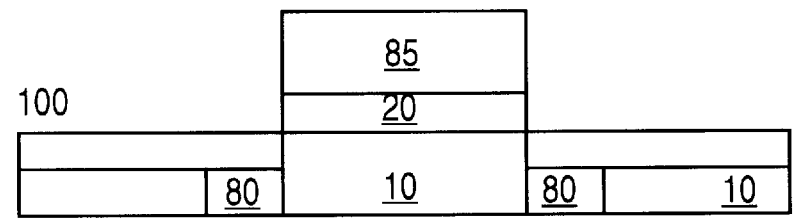
FIG. 2p illustrates the semiconductor substrate corresponding to the first embodiment of the present invention after dopants are implanted to form the shallow junctions of the substrate.
Figure 2Q:
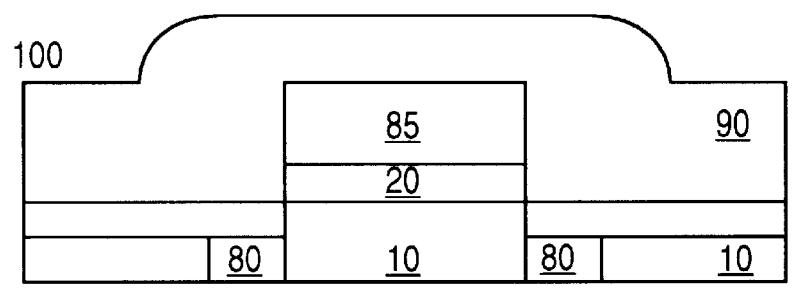
FIG. 2q illustrates the semiconductor substrate corresponding to the first embodiment of the present invention after the silicon nitride layer is formed.
Figure 2R:
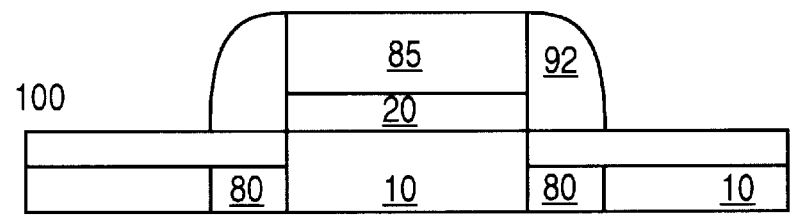
FIG. 2r illustrates the semiconductor substrate corresponding to the first embodiment of the present invention after the nitride spacers are formed.
Figure 2S:
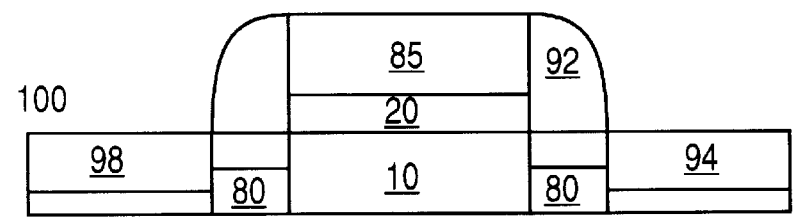
FIG. 2s illustrates the semiconductor substrate corresponding to the first embodiment of the present invention after fabrication of the semiconductor substrate into a transistor has been completed.

FIG. 2o illustrates semiconductor substrate 100 after dioxide spacer 55 is removed. Semiconductor substrate 100 is now prepared to be transformed into a transistor. FIG. 2p illustrates semiconductor substrate 100 after dopants are implanted to form shallow junctions just under the surface of substrate 10, adjacent to both sides of polysilicon gate 85. A silicon nitride layer 90 is then formed over substrate 10 and polysilicon gate 85 (FIG. 2q). Next, silicon nitride layer 90 is etched to form nitride spacers 92, as illustrated in FIG. 2r. Nitride spacers 92 are formed on the sidewalls of polysilicon gate 85, and cover the shallow junction areas of substrate 10. Subsequently, more dopants are implanted to form deep junctions into the exposed regions of substrate 10. Consequently, substrate 10 is transformed into a source region 94 and a drain region 98 shown in FIG. 2s. At this point the fabrication of semiconductor substrate 10 into a transistor has been completed. Substrate 10 may be n-doped (with source region 94 and drain region 98 consisting of $n^+$ ions, while halo structures consist of $p^-$ ions), or $p^+$ doped (with source region 40 and drain region 50 consisting of $p^+$ ions, while halo structures consist of $n^-$ ions). It will be obvious to one with ordinary skill in the art that the doping of source region 94, drain region 98, and halo implants 80 may be made up of a variety of doping patterns. Also, the first and second implant of dopants into source region 94 and drain region 98 may include different doping patterns (e.g., the first implant of drain region may include $p^+$ ions, while the second implant contains $p^{++}$ ions). Thus the example given above with respect to n- type transistor is meant to be merely illustrative and not limiting.

It is apparent from this embodiment that halo structures 80 are localized to the tight box-like regions immediately adjacent to polysilicon gate 85 only. It is therefore possible to tightly control the halo structure in thin regions of substrate 10 at each side of polysilicon gate 85. Consequently, Short Channel Effects are prevented without having to use an extra mask or overly control temperature during the halo structure implant process.

According to a second embodiment, another novel method of controlling the implanting of halo structures into a semiconductor substrate that is to be fabricated into a transistor is shown. In this method, spacers are formed, and later removed from the gate edge. After the spacers are removed, halo structures are implanted into the portion of the source and drain regions that is immediately adjacent to the gate, while the remaining regions of the substrate remain masked.

Figure 3A:
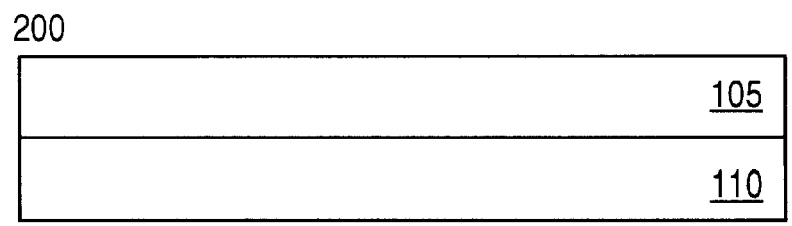
FIG. 3a illustrates a semiconductor substrate corresponding to the second embodiment of the present invention.
Figure 3B:
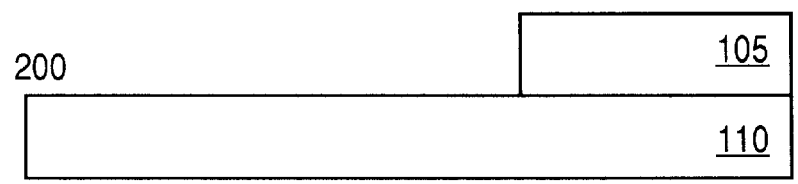
FIG. 3b illustrates the semiconductor substrate corresponding to the second embodiment of the present invention after the silicon nitride layer is patterned and removed.
Figure 3C:
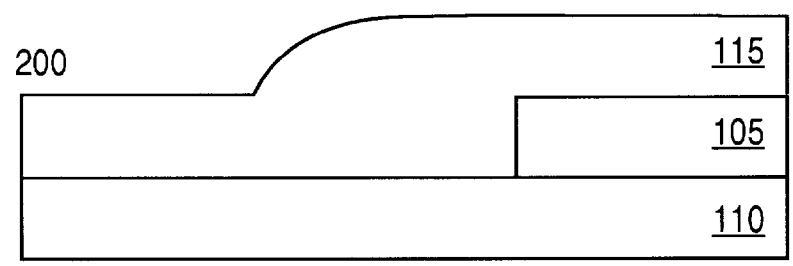
FIG. 3c illustrates the semiconductor substrate corresponding to the second embodiment of the present invention after the silicon dioxide layer is conformally deposited.
Figure 3D:
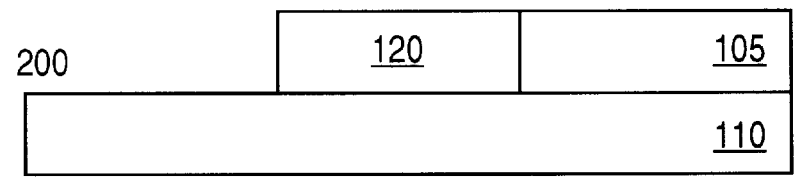
FIG. 3d illustrates the semiconductor substrate corresponding to the second embodiment of the present invention after the dioxide spacer is formed.
Figure 3E:
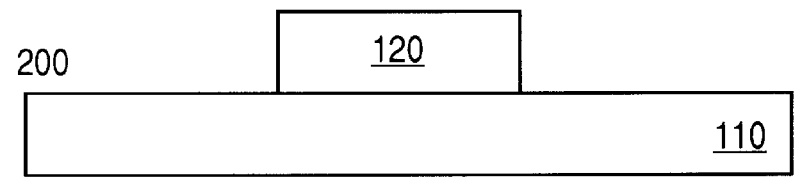
FIG. 3e illustrates the semiconductor substrate corresponding to the second embodiment of the present invention after the silicon nitride layer is stripped off.

Referring to FIG. 3a, a semiconductor substrate 200 is shown. Semiconductor substrate 200 includes a silicon nitride layer 105 and a substrate 110. Semiconductor substrate 200 is initially configured in a manner such that silicon nitride layer 105 is formed over substrate 110. Now referring to FIG. 3b, silicon nitride layer 105 is patterned and removed. Next, a silicon dioxide layer 115 is conformally deposited over silicon nitride layer 105 and substrate 110, as shown in FIG. 3c. Silicon dioxide layer 115 is then etched anisotropically, leaving a dioxide spacer 120 (FIG. 3d). FIG. 3e illustrates semiconductor substrate 200 after silicon nitride layer 105 is stripped off, leaving dioxide spacer 120 as the only remaining layer remaining on substrate 110.

Figure 3F:
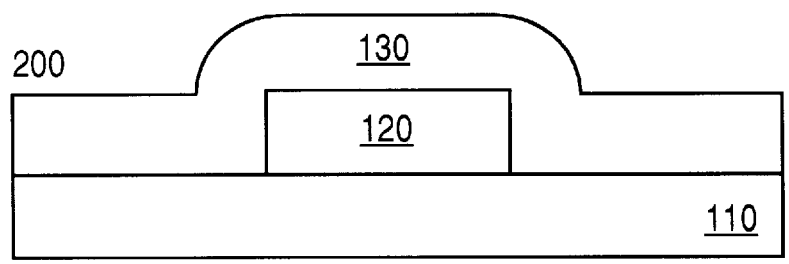
FIG. 3f illustrates the semiconductor substrate corresponding to the second embodiment of the present invention after the second silicon nitride layer is formed.
Figure 3G:
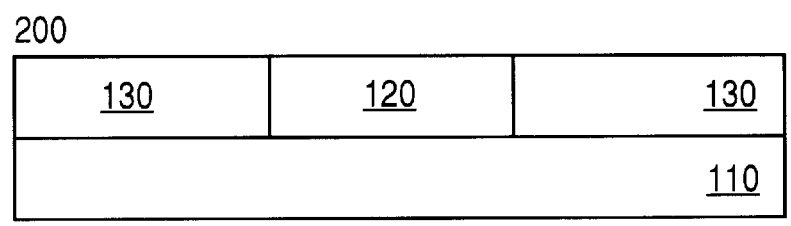
FIG. 3g illustrates the semiconductor substrate corresponding to the second embodiment of the present invention after the silicon nitride layer is planarized.
Figure 3H:
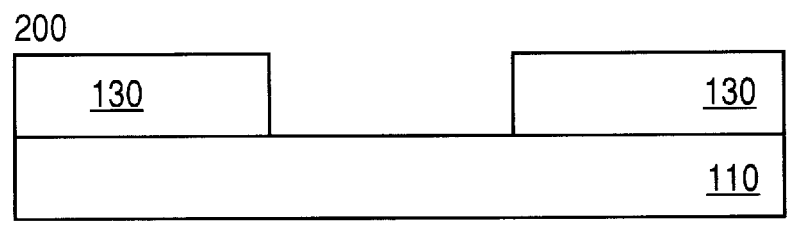
FIG. 3h illustrates the semiconductor substrate corresponding to the second embodiment of the present invention after the dioxide spacer is selectively etched.
Figure 3I:
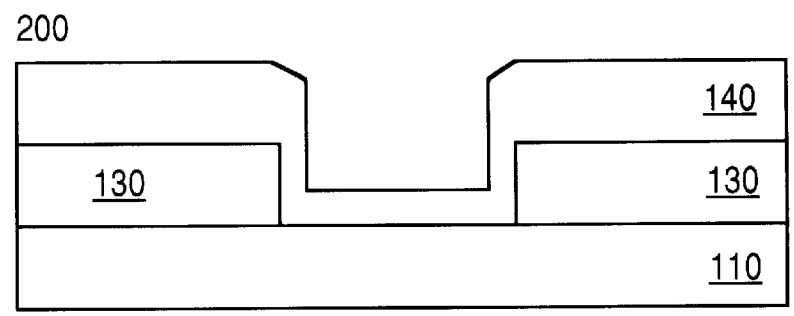
FIG. 3i illustrates the semiconductor substrate corresponding to the second embodiment of the present invention after the second silicon dioxide layer is conformally deposited.
Figure 3J:
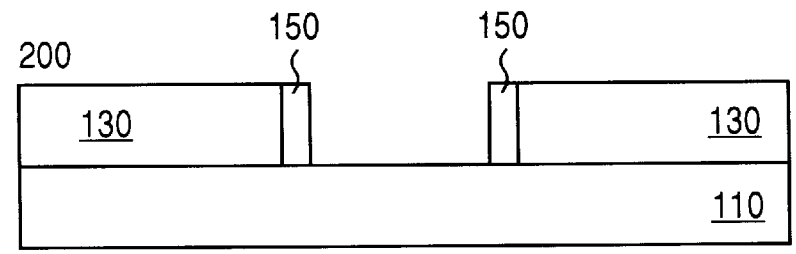
FIG. 3j illustrates the semiconductor substrate corresponding to the second embodiment of the present invention after dioxide spacers are formed.
Figure 3K:
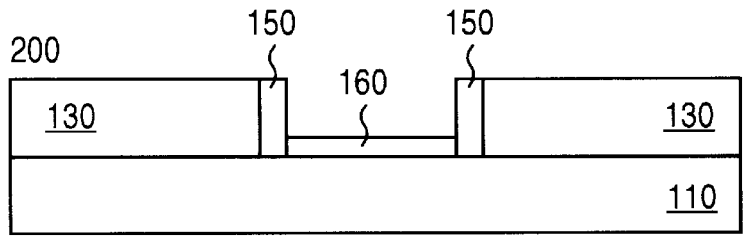
FIG. 3k illustrates the semiconductor substrate corresponding to the second embodiment of the present invention after the thin dioxide layer is formed.

Now referring to FIG. 3f, a silicon nitride layer 130 is formed over substrate 110 and dioxide spacer 120. Silicon nitride layer 130 is then planarized, as illustrated in FIG. 3g. Dioxide spacer 120 is selectively etched so that a section of substrate 110 is exposed as shown in FIG. 3h. Subsequently, a second silicon dioxide layer 140 is conformally deposited (FIG. 3i). Silicon dioxide layer 140 is deposited such that silicon nitride layer 130 and the previously exposed section of substrate 110 is completely covered. Next, silicon dioxide layer 140 is anisotropically etched to form dioxide spacers 150. Dioxide spacers 150 are aligned on each sidewall of silicon nitride layer 130, as shown in FIG. 3j. The exposed section of substrate 110, a result from etching silicon dioxide layer 140, is oxidized to produce a thin dioxide layer 160 (FIG. 3k).

Figure 3L:
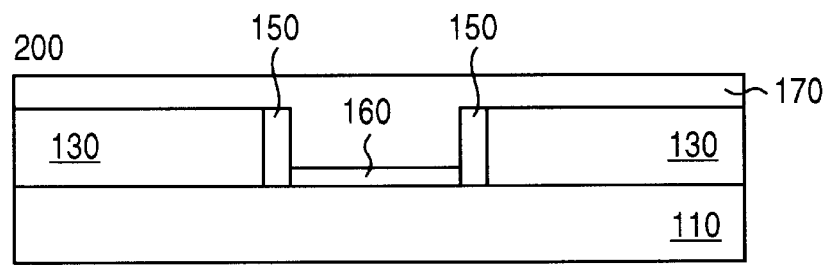
FIG. 3l illustrates the semiconductor substrate corresponding to the second embodiment of the present invention after the polysilicon layer is deposited.
Figure 3M:
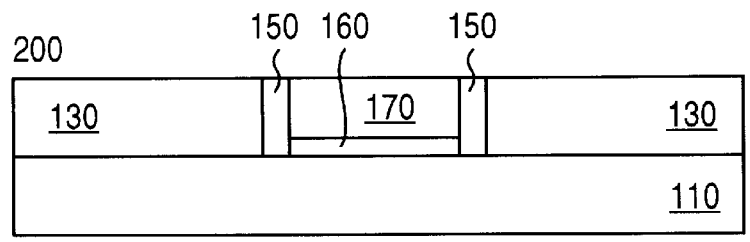
FIG. 3m illustrates the semiconductor substrate corresponding to the second embodiment of the present invention after the polysilicon layer is planarized.
Figure 3N:
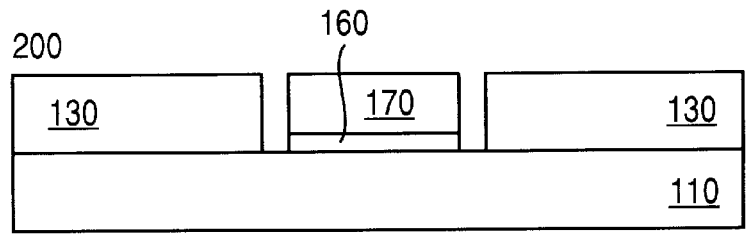
FIG. 3n illustrates the semiconductor substrate corresponding to the second embodiment of the present invention after the dioxide spacers are etched.
Figure 3O:
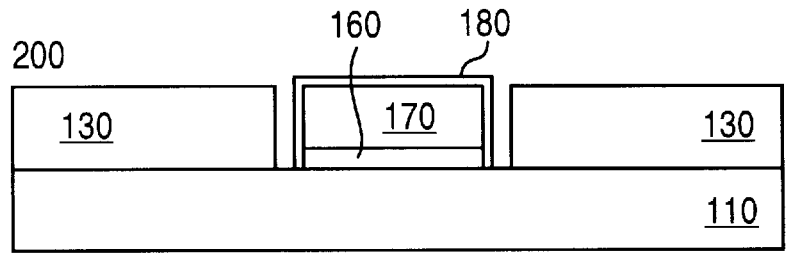
FIG. 3o illustrates the semiconductor substrate corresponding to the second embodiment of the present invention after the dioxide layer is formed.
Figure 3P:
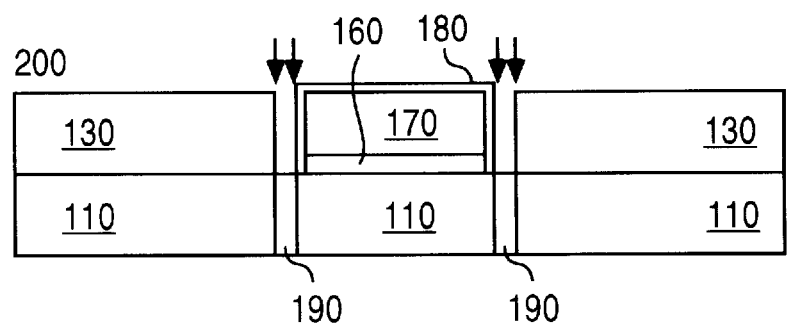
FIG. 3p illustrates the semiconductor substrate corresponding to the second embodiment of the present invention after the halo structures are implanted.

FIG. 3l illustrates semiconductor substrate 200 after polysilicon layer 170 is deposited over thin dioxide layer 160 and between dioxide spacers 150. Polysilicon layer 170 is then planarized, resulting in FIG. 3m. The portion of polysilicon layer 170 between dioxide spacers 150 will serve as the gate of the transistor that is to be fabricated. Next, dioxide spacers 150 are selectively etched so that substrate 110 is exposed (FIG. 3n). Polysilicon layer 170 is then oxidized to produce a dioxide layer 180 that covers polysilicon layer 170 (FIG. 3o). Dioxide layer 180 is deposited to prevent polysilicon layer 170 from being removed during later etching steps. Next, halo structures 190 are implanted into the exposed regions of substrate 110, as illustrated in FIG. 3p.

Figure 3Q:
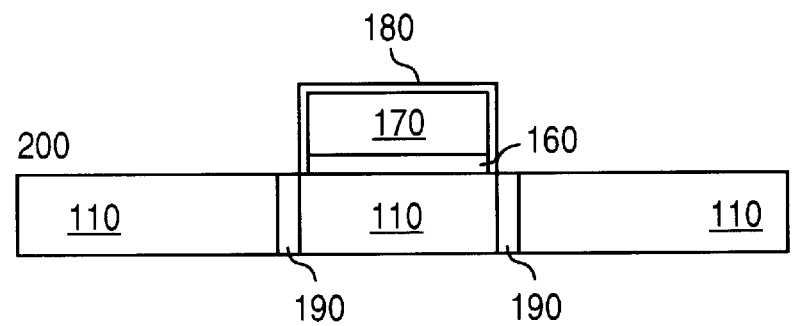
FIG. 3q illustrates the semiconductor substrate corresponding to the second embodiment of the present invention after the silicon nitride layer is removed.
Figure 3R:
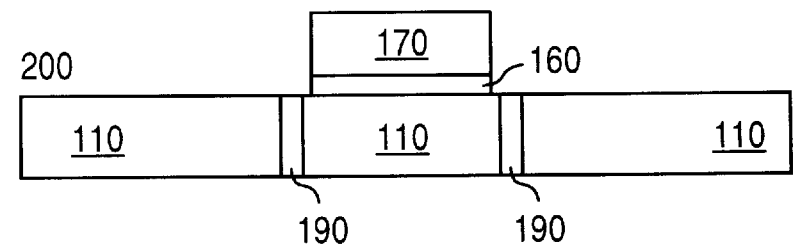
FIG. 3r illustrates the semiconductor substrate corresponding to the second embodiment of the present invention after the dioxide layer has been removed.

Referring to FIG. 3q, silicon nitride layer 130 is removed from semiconductor substrate 200, exposing substrate 110. Finally, FIG. 3r illustrates wafer 200 after dioxide layer 180 has been removed. At this point semiconductor substrate 200 is prepared to be transformed into a transistor. The remaining steps of fabricating semiconductor substrate 200 into a transistor are typical to those demonstrated in FIGS. 2p–2t.

It is apparent that the result of the process described in this embodiment is identical to the embodiment described above, as the halo structures are localized to the regions immediately adjacent to polysilicon layer 170. Likewise, the process described in this embodiment tightly controls the halo structure in thin regions of substrate 110 at each side of polysilicon layer 170; preventing Short Channel Effects without having to use an extra mask or overly control temperature during the halo structure process.

According to yet another embodiment, a halo structure is implanted into only one side of the gate of a transistor in a manner such that a gate plug is deposited on the sidewall of a mask to limit the spacer formation to a single side of the gate.

Figure 4A:
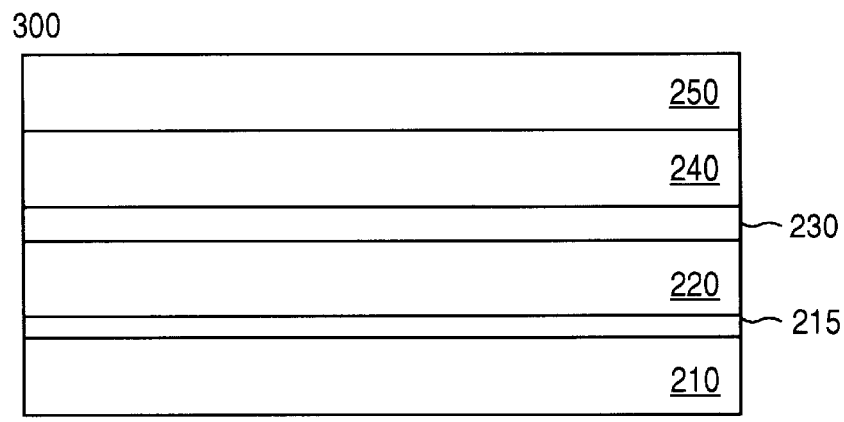
FIG. 4a illustrates a semiconductor substrate corresponding to the third embodiment of the present invention.
Figure 4B:
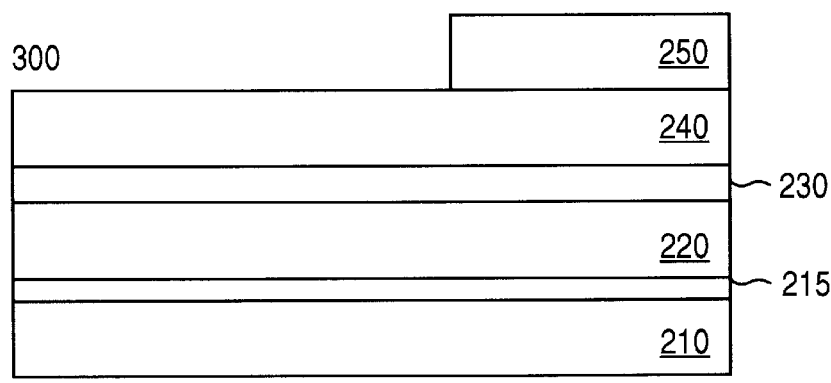
FIG. 4b illustrates the semiconductor substrate corresponding to the third embodiment of the present invention after the photoresist layer is patterned and removed.
Figure 4C:
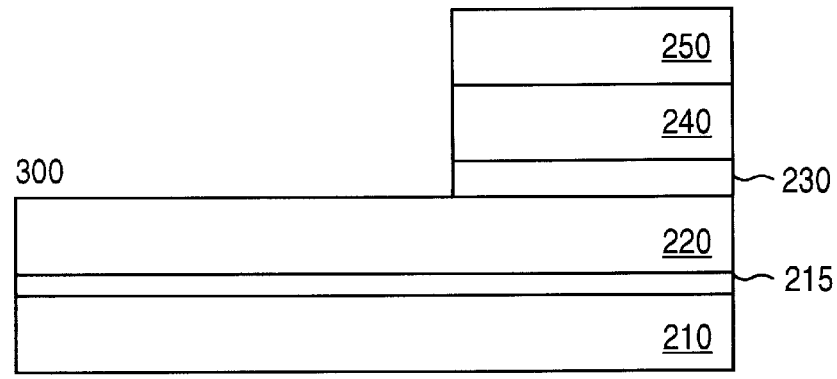
FIG. 4c illustrates the semiconductor substrate corresponding to the third embodiment of the present invention after the silicon dioxide layer and the silicon nitride layer are etched away.
Figure 4D:
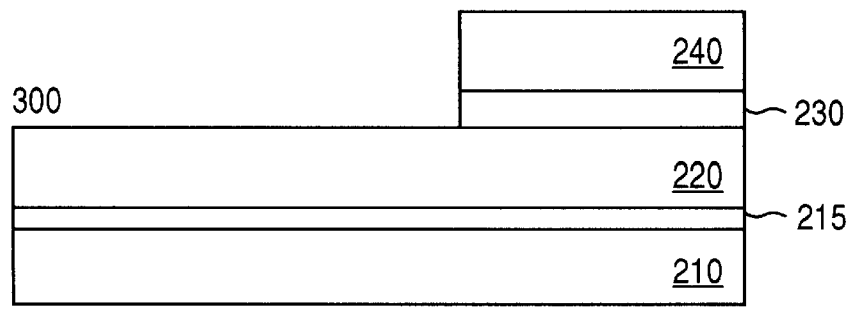
FIG. 4d illustrates the semiconductor substrate corresponding to the third embodiment of the present invention after the photoresist layer is removed.

FIG. 4a illustrates a semiconductor substrate 300 according to the present embodiment. Semiconductor substrate 300 comprises a substrate 210, a thin dioxide layer 215, a polysilicon layer 220, a silicon dioxide layer 230, a silicon nitride layer 240, and a photoresist layer 250. Wafer 300 is initially configured in a manner such that thin dioxide layer 215 is deposited over substrate 210; polysilicon layer 220 is deposited over thin dioxide layer 215; silicon dioxide layer 230 is deposited over polysilicon layer 220; silicon nitride layer 240 is deposited over silicon dioxide layer 230; and photoresist layer 250 is deposited over silicon nitride layer 240. First, photoresist layer 250 is patterned and removed, as illustrated in FIG. 4b. Next, the regions of silicon dioxide layer 230 and silicon nitride layer 240 that are not covered by photoresist layer 250 is etched away (FIG. 4c). Photoresist layer 250 is then removed, as illustrated in FIG. 4d.

Figure 4E:
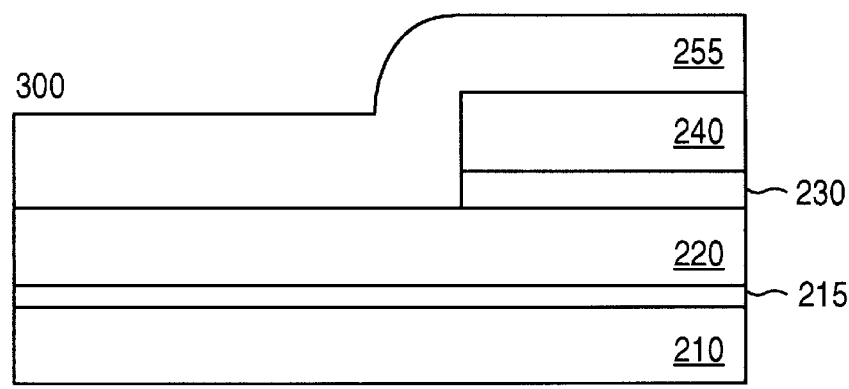
FIG. 4e illustrates the semiconductor substrate corresponding to the third embodiment of the present invention after the second silicon nitride layer is deposited.
Figure 4F:
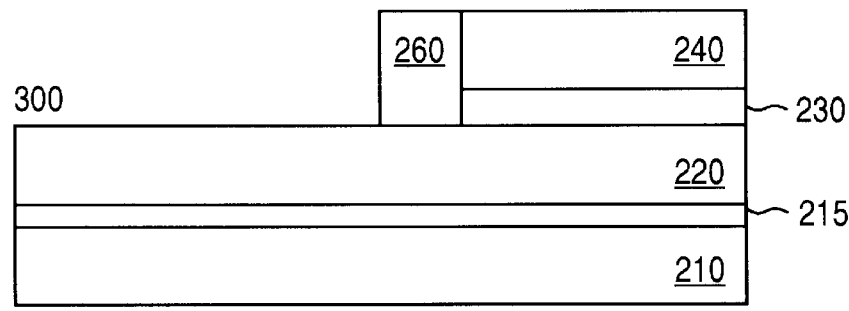
FIG. 4f illustrates the semiconductor substrate corresponding to the third embodiment of the present invention after the nitride spacer is formed.
Figure 4G:
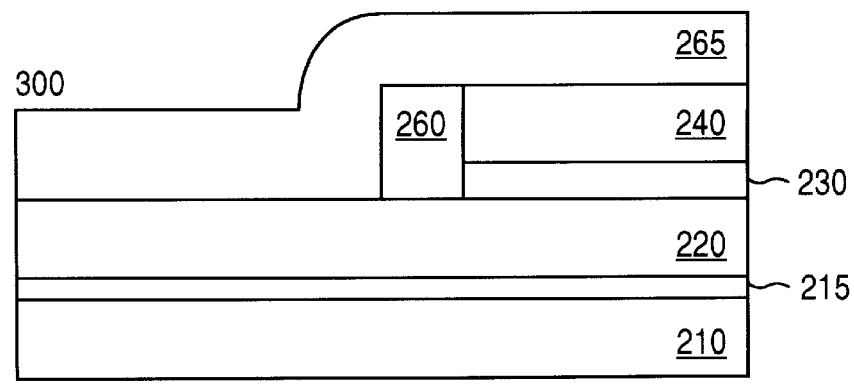
FIG. 4g illustrates the semiconductor substrate corresponding to the third embodiment of the present invention after the second silicon dioxide layer is deposited.
Figure 4H:
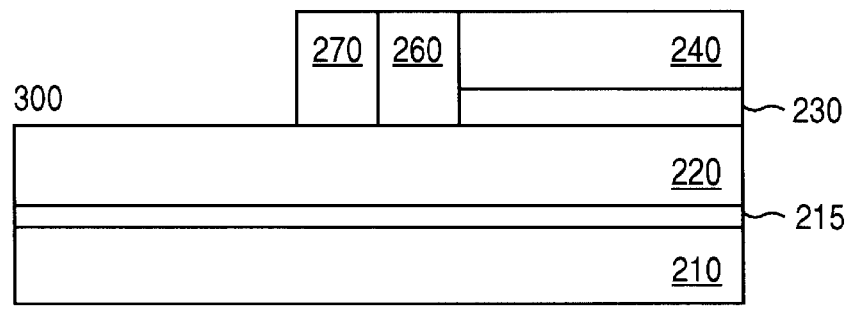
FIG. 4h illustrates the semiconductor substrate corresponding to the third embodiment of the present invention after the dioxide spacer is formed.

Referring to FIG. 4e, a second silicon nitride layer 255 is deposited over silicon nitride layer 240 and the exposed section of polysilicon layer 220. Silicon nitride layer 255 is then anisotropically etched to form a nitride spacer 260, as shown in FIG. 4f. Next, a second silicon dioxide layer 265 is deposited over silicon nitride layer 240, nitride spacer 260 and the exposed region of polysilicon layer 220 (FIG. 4g). Silicon dioxide layer 265 is then anisotropically etched to form a dioxide spacer 270, as illustrated in FIG. 4h.

Figure 4I:
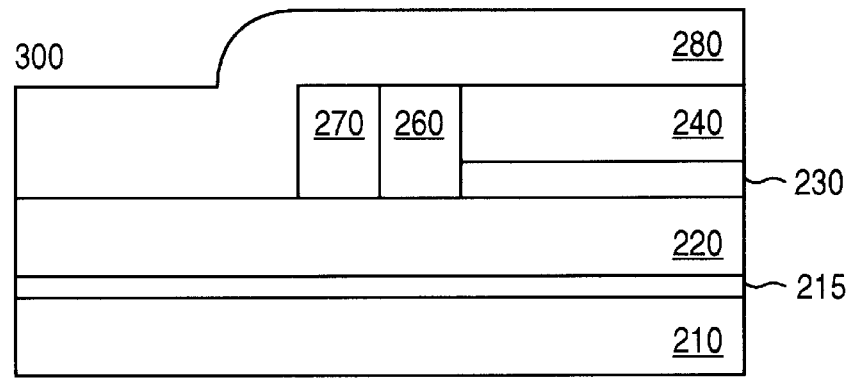
FIG. 4i illustrates the semiconductor substrate corresponding to the third embodiment of the present invention after the photoresist layer is deposited.
Figure 4J:
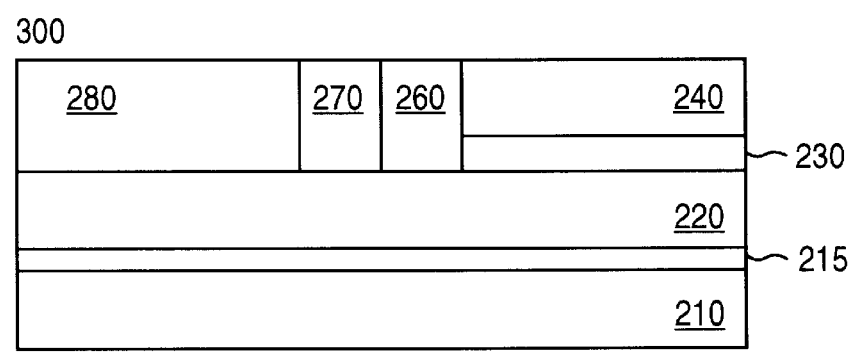
FIG. 4j illustrates the semiconductor substrate corresponding to the third embodiment of the present invention after the photoresist layer is planarized.
Figure 4K:
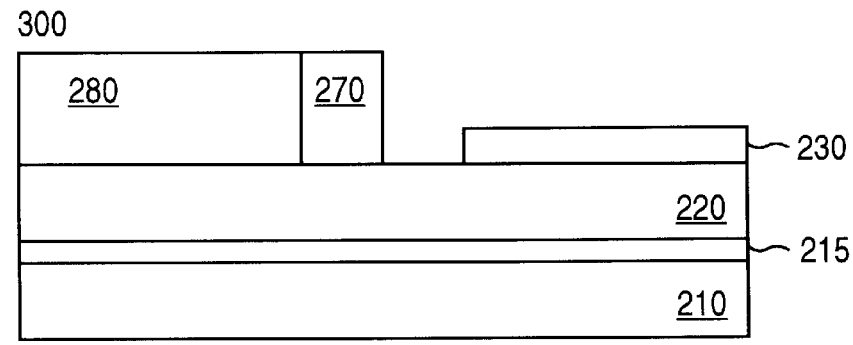
FIG. 4k illustrates the semiconductor substrate corresponding to the third embodiment of the present invention after the silicon nitride layer and the nitride spacer are etched.
Figure 4L:
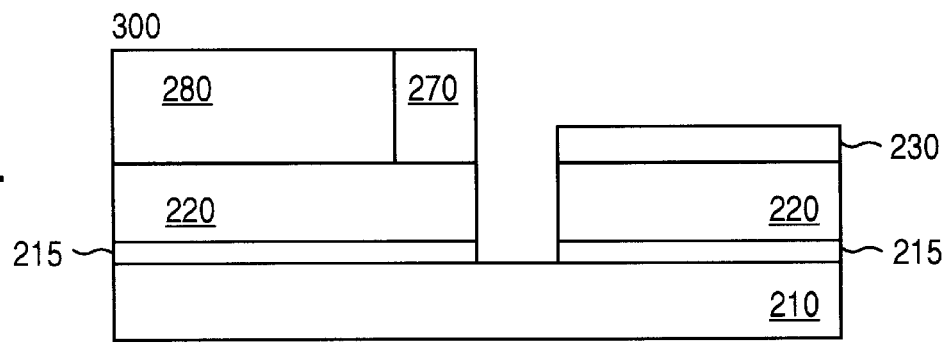
FIG. 4l illustrates the semiconductor substrate corresponding to the third embodiment of the present invention after the polysilicon layer and thin dioxide layer are etched.

Subsequent to dioxide spacer 270 being formed, a photoresist layer 280 is deposited over silicon nitride layer 240, nitride spacer 260, dioxide spacer 270, and polysilicon layer 220 (FIG. 4i). Photoresist layer 280 is then planarized, as shown in FIG. 4j. FIG. 4k illustrates semiconductor substrate 300 after silicon nitride layer 240 and nitride spacer 260 are etched. The removal of silicon nitride layer 240 causes silicon dioxide layer 230 to be exposed. Also, the removal of nitride spacer 260 results in a portion of polysilicon layer 220 being exposed. The exposed portion of polysilicon layer 220, along with the underlying portion of thin dioxide layer 215, is etched away, causing a section of substrate 210 immediately below to be unmasked (FIG. 4l).

Figure 4M:
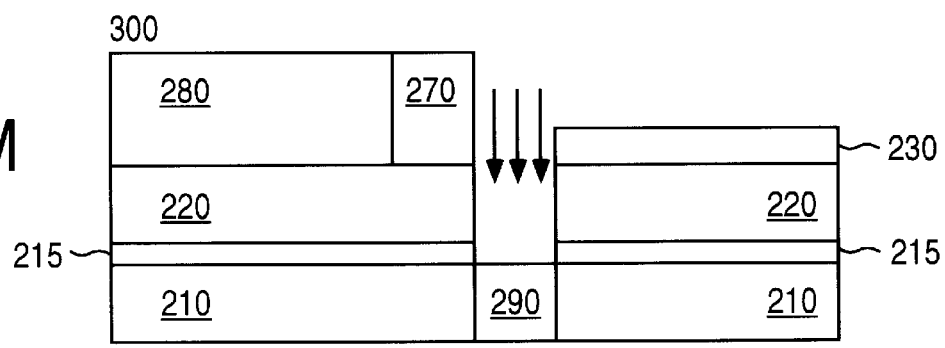
FIG. 4m illustrates the semiconductor substrate corresponding to the third embodiment of the present invention after the halo structure has been implanted.
Figure 4N:
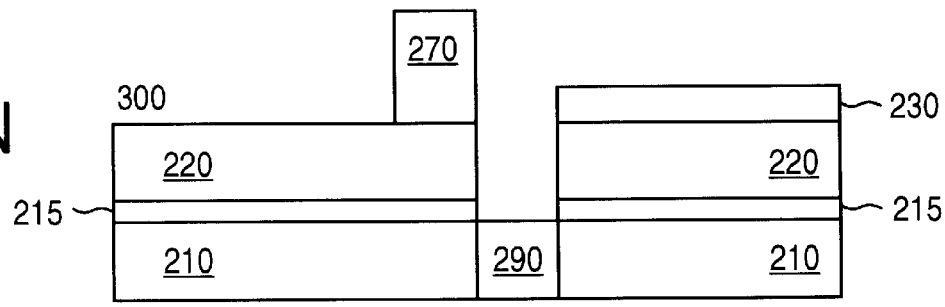
FIG. 4n illustrates the semiconductor substrate corresponding to the third embodiment of the present invention after the photoresist layer is etched away.
Figure 4O:
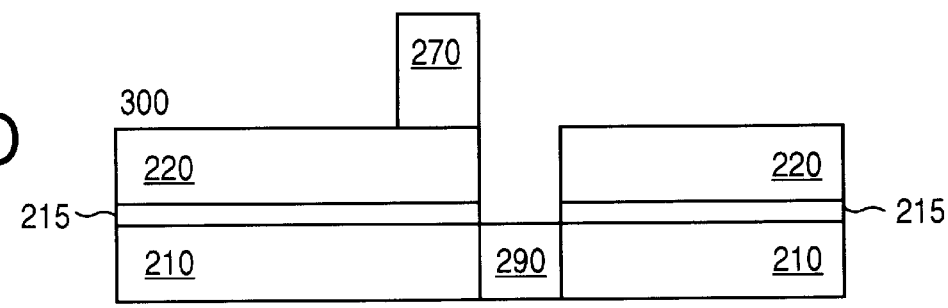
FIG. 4o illustrates the semiconductor substrate corresponding to the third embodiment of the present invention after the silicon dioxide layer is removed.
Figure 4P:
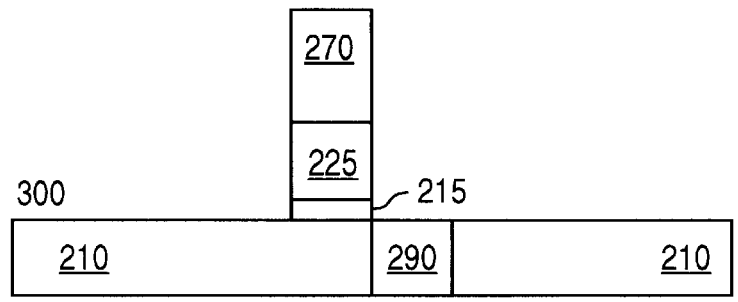
FIG. 4p illustrates the semiconductor substrate corresponding to the third embodiment of the present invention after the polysilicon layer and thin oxide layer are etched.

FIG. 4m illustrates semiconductor substrate 300 after halo structure 290 has been implanted. Subsequently, photoresist layer 280 is etched away, as illustrated in FIG. 4n. Silicon dioxide layer 230 is then removed, as shown in FIG. 4o. Since silicon dioxide layer 230 and dioxide spacer 270 consists of the same material, silicon dioxide layer 230 is flashed off. Dioxide spacer 270 is not drastically effected by flashing off silicon dioxide layer 230 since silicon dioxide layer 230 is substantially thinner. Next, all of polysilicon layer 220 and thin dioxide layer 215 not covered by dioxide spacer 270 is etched, resulting in FIG. 4p. The remaining segment of polysilicon layer 220 is a polysilicon gate 225. Polysilicon gate 225 will serve as the gate of the transistor that will be fabricated later on in the process.

Figure 4Q:
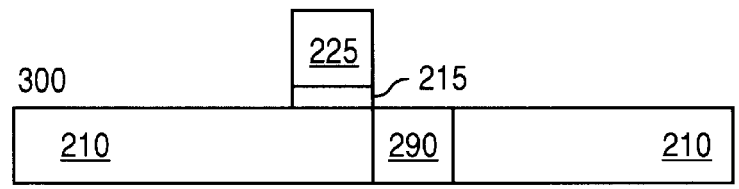
FIG. 4q illustrates the semiconductor substrate corresponding to the third embodiment of the present invention after the dioxide spacer has been removed.
Figure 4R:
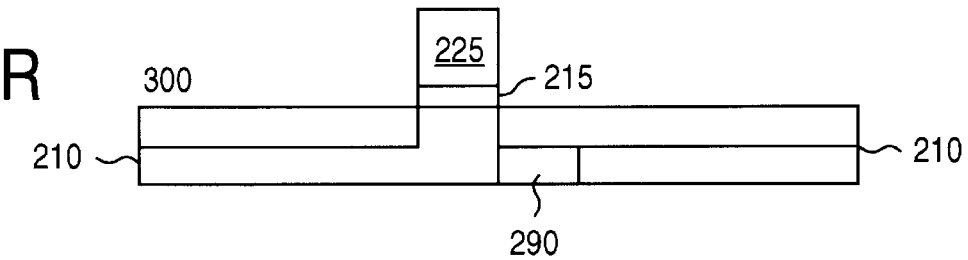
FIG. 4r illustrates the semiconductor substrate corresponding to the third embodiment of the present invention after the dopants are implanted to form the shallow junctions of the substrate.
Figure 4S:
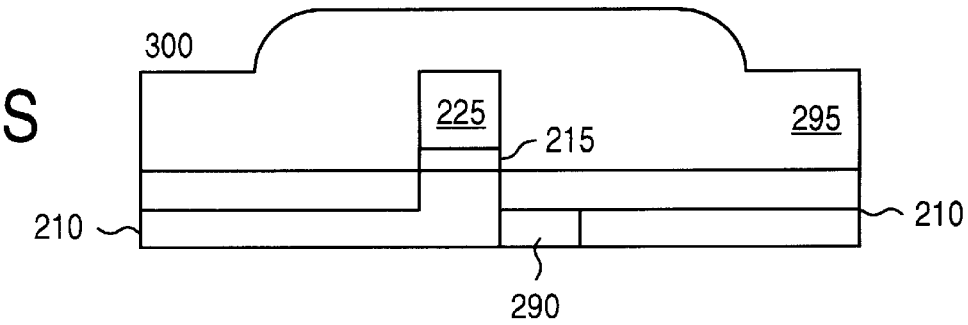
FIG. 4s illustrates the semiconductor substrate corresponding to the third embodiment of the present invention after the silicon nitride layer is formed.
Figure 4T:
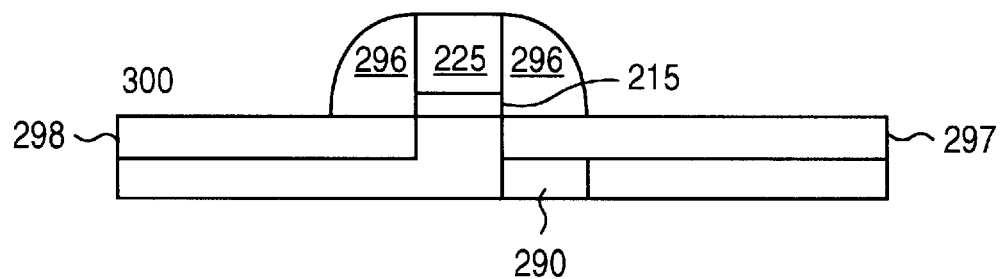
FIG. 4t illustrates the semiconductor substrate corresponding to the third embodiment of the present invention after the nitride spacers are formed.
Figure 4U:
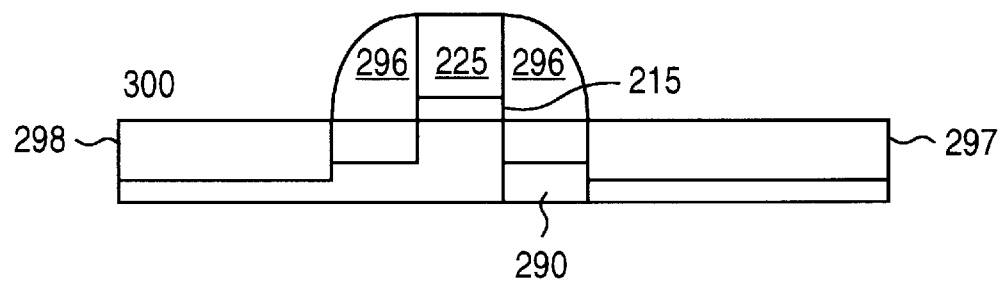
FIG. 4u illustrates the semiconductor substrate corresponding to the third embodiment of the present invention after fabrication of the semiconductor substrate into a transistor has been completed.

FIG. 4q illustrates semiconductor substrate 300 after dioxide spacer 270 has been removed. Semiconductor substrate 300 is now prepared to be transformed into a transistor. FIG. 4r illustrates semiconductor substrate 300 after dopants are implanted to form shallow junctions just under the surface of substrate 210, on both sides of polysilicon gate 225. A silicon nitride layer 295 is then formed over substrate 210 and polysilicon gate 225 (FIG. 4s). Next, silicon nitride layer 295 is etched to form nitride spacers 296, as illustrated in FIG. 4t. Nitride spacers 296 are formed on the sidewalls of polysilicon gate 225, and cover the shallow junction areas of substrate 210. Subsequently, more dopants are implanted to form deep junctions into the exposed regions of substrate 210. Consequently, substrate 210 is transformed into a source region 297 and a drain region 298 shown in FIG. 4u. At this point the fabrication of semiconductor substrate 300 into a transistor has been completed. According to the present embodiment, the halo structure is implanted into the source region. However, one skilled in the art will appreciate that the halo structure may be implanted the into drain region. Thus the example given above with respect to implanting the halo structure into the source region is meant to be merely illustrative and not limiting.

Figure 1J:
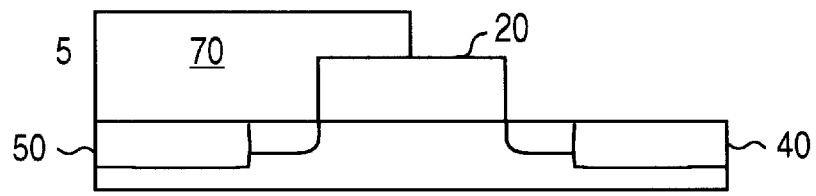
FIG. 1j illustrates a semiconductor substrate to be fabricated into a transistor according to the prior art method of fabricating transistors after a photoresist mask has been formed.
Figure 1K:
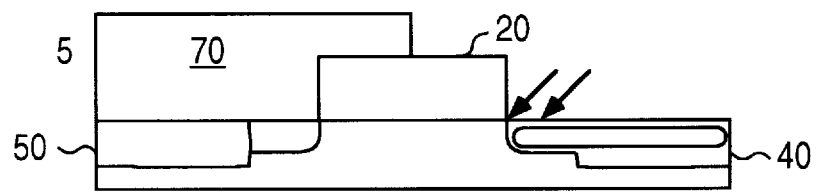
FIG. 1k illustrates a semiconductor substrate to be fabricated into a transistor according to the prior art method of fabricating transistors after a halo structure is implanted into the source region.
Figure 1L:
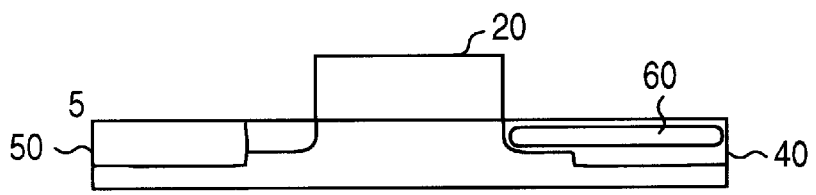
FIG. 1l illustrates a semiconductor substrate to be fabricated into a transistor according to the prior art method of fabricating transistors after the photoresist layer has been removed.
Figure 1M:
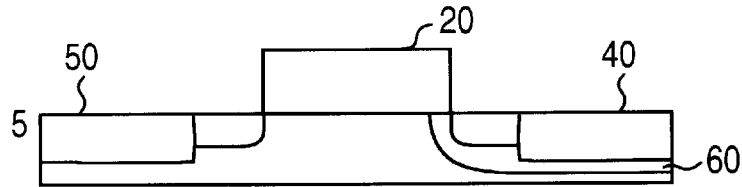
FIG. 1m illustrates a semiconductor substrate to be fabricated into a transistor according to the prior art method of fabricating transistors after the substrate is heated.
Figure 1N:
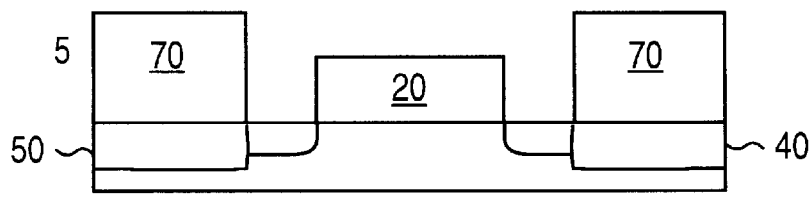
FIG. 1n illustrates a semiconductor substrate to be fabricated into a transistor according to the prior art method of fabricating transistors after a photoresist layer is formed.
Figure 1O:
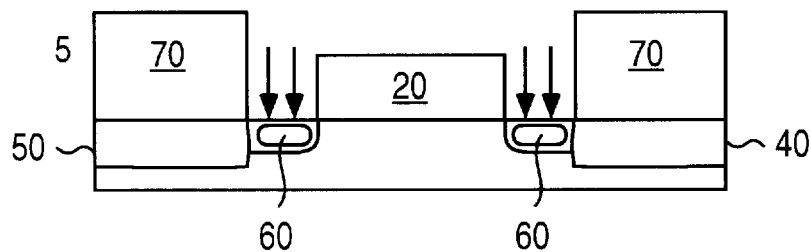
FIG. 1o illustrates a semiconductor substrate to be fabricated into a transistor according to the prior art method of fabricating transistors after halo structures are implanted.
Figure 1P:
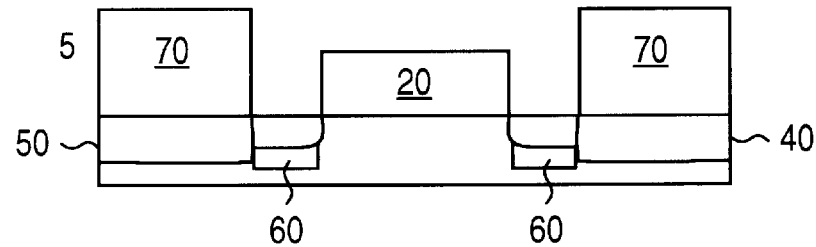
FIG. 1p illustrates a semiconductor substrate to be fabricated into a transistor according to the prior art method of fabricating transistors after the substrate is heated.
Figure 1Q:
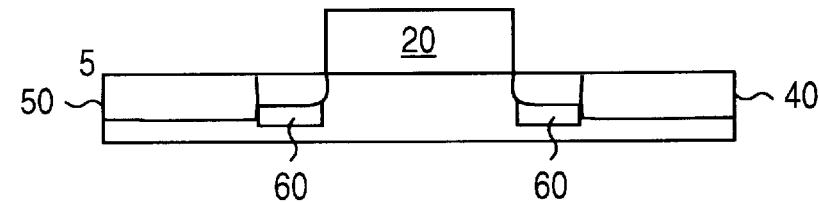
FIG. 1q illustrates a semiconductor substrate to be fabricated into a transistor according to the prior art method of fabricating transistors after the photoresist layer is removed.

It is apparent that the halo structure in wafer 300 is localized to a tight region immediately adjacent to gate 225. The process described in this embodiment tightly controls the halo structure in a thin region on the drain region side of the gate; thereby preventing Short Channel Effects without having to use an extra mask or overly control temperature during the halo structure process. Furthermore, this method precludes having to use an extra mask in order to block the other side of the transistor. As shown in FIG. 1j, the LATID method requires a mask to be formed over the drain region in order to implant a sole halo structure in the source region. The ability to implant a single halo structure in the transistor greatly reduces the time and expense of processing the transistor.

Although the present invention has been described in terms of preferred embodiments, it will be appreciated that various modifications and alterations might be made by persons skilled in the art without departing from the spirit and scope of the invention. For example, dioxide spacer 55 of the first embodiment may be altered to be comprised of silicon nitride or other materials. Therefore, the foregoing discussion should be regarded as illustrative only and the invention measured only in terms of the claims which follow.

What is claimed is:

1. On a semiconductor substrate comprising a first layer, a second layer, a third layer, and a fourth layer, a method of implanting halo structures into a transistor comprising the steps of:

patterning the fourth layer;

depositing a fifth layer over the fourth layer;

etching the fifth layer so that a first spacer is formed;

removing the fourth layer;

depositing a sixth layer over the third layer and the first spacer;

etching the sixth layer so that a second spacer and a third spacer are formed;

depositing and planarizing a seventh layer;

removing the second spacer, the third spacer, and the exposed portion of the third layer;

implanting halo structures into the exposed sections of the first layer;

removing the seventh layer, and the exposed portion of the third layer;

removing the exposed portion of the third layer;

removing the exposed portion of the second layer; and removing the first spacer.

2. The method of claim 1 wherein the first layer is comprised of silicon, wherein the second layer is comprised of a gate dielectric, wherein the third layer is comprised of polysilicon, wherein the fourth layer is comprised of silicon nitride.

3. The method of claim 1 wherein the fifth layer is comprised of silicon dioxide and the sixth layer is comprised of silicon nitride.

4. The method of claim 1 wherein the fifth layer is comprised of silicon nitride and the sixth layer is comprised of silicon dioxide.

5. The method of claim 1 wherein the seventh layer is a photoresist layer.

6. On a silicon wafer comprising a first layer, and a second layer formed over the first layer, a method of implanting a halo structure into a transistor comprising the steps of:

patterning the second layer;

forming a third layer over the first layer and the second layer;

etching the third layer so that a first spacer is formed out of the third layer, wherein the first spacer is on the sidewall of the second layer;

removing the second layer;

forming a fourth layer over the first spacer and the remainder of the first layer;

planarizing the fourth layer;

etching the first spacer;

conformally depositing a fifth layer;

etching the fifth layer so that a second spacer and a third spacer is formed out of the fifth layer, wherein the second spacer and the third spacer are aligned on the sidewalls of the fourth layer;

forming a sixth layer over the exposed portion of the first layer, wherein the exposed portion of the first layer is between the second spacer and the third spacer;

forming a seventh layer over the fourth layer, the sixth layer, the second spacer and the third spacer;

planarizing the seventh layer;

removing the second spacer and the third spacer;

forming an eighth layer over the seventh layer;

implanting halo structures;

removing the fourth layer; and removing the eighth layer.

7. The method of claim 6 wherein the first layer is comprised of silicon, wherein the second layer is comprised of silicon nitride, wherein the third layer is comprised of silicon dioxide.

8. The method of claim 6 wherein the fourth layer is comprised of silicon nitride and the fifth layer is comprised of silicon dioxide.

9. The method of claim 6 wherein the fourth layer is comprised of silicon dioxide and the fifth layer is comprised of silicon nitride.

10. The method of claim 6 wherein the step of etching the fifth layer to form the second and third spacers is carried out by anisotropic etching.

11. The method of claim 6 wherein the sixth layer is comprised of a gate dielectric.

12. The method of claim 6 wherein the seventh layer is comprised of polysilicon.

13. The method of claim 6 wherein the seventh layer is a gate of the transistor.

14. The method of claim 6 wherein the eighth layer is comprised of a thin dioxide layer.

15. On a semiconductor substrate comprising a first layer, a second layer formed on the first layer, a third layer formed on the second layer, a fourth layer formed on the third layer, a fifth layer formed over the fourth layer, and a sixth layer formed over the fifth layer, a method of implanting a halo structure in a transistor comprising the steps of:

patterning the sixth layer so that a portion of the fifth layer is exposed;

removing the exposed portion of the fifth layer;

removing the exposed portion of the fourth layer;

removing the sixth layer;

forming a seventh layer over the fifth layer and the third layer;

etching the seventh layer so that a first spacer is formed out of the seventh layer, wherein the first spacer is located on the sidewall of the fourth and fifth layers;

forming an eighth layer over the third layer, the fifth layer, and the first spacer;

etching the eighth layer so that a second spacer is formed out of the eighth layer, wherein the second spacer is located on the sidewall of the first spacer;

depositing a ninth layer on the uncovered portion of the third and fifth layers, and the first and second spacers;

planarizing the ninth layer;

removing the first spacer;

removing the fifth layer;

removing the uncovered portion of the third layer, wherein the uncovered portion of the third layer is the portion previously covered by the first spacer;

removing the uncovered portion of the second layer;

implanting a halo structure;

removing the ninth layer;

removing the fourth layer;

removing the exposed portion of the third layer; wherein the exposed portion of the third layer is the portion not covered by the second spacer;

removing the exposed portion of the second layer; wherein the exposed portion of the second layer is the portion not covered by the second spacer; removing the second spacer.

16. The method of claim 15 wherein the first layer is comprised of silicon, wherein the second layer is comprised of a gate dielectric, wherein the third layer is comprised of polysilicon, wherein the fourth layer is comprised of silicon dioxide, wherein the fifth layer is comprised of silicon nitride, wherein the sixth layer is a photoresist layer.

17. The method of claim 15 wherein the seventh layer is comprised of silicon nitride and the eighth layer is comprised of silicon dioxide.

18. The method of claim 15 wherein the seventh layer is comprised of silicon dioxide and the eighth layer is comprised of silicon nitride.

19. The method of claim 15 wherein the ninth layer is a photoresist layer.

20. The method of claim 15 wherein the step of removing the fourth layer is carried out by flashing off the fourth layer.

21. The method of claim 15 wherein the halo structure is implanted on the source side of the transistor.

22. The method of claim 15 wherein the halo structure is implanted on the drain side of the transistor.

* * * * *

UNITED STATES PATENT AND TRADEMARK OFFICE
CERTIFICATE OF CORRECTION

PATENT NO.    : 5,834,355
DATED         : November 10, 1999
INVENTOR(S)   : Doyle It is certified that error appears in the above-identified patent and that said Letters Patent is hereby corrected as shown below:

<u>Title page,</u>
Item [54], delete "SPACER" and insert -- SPACERS --.

Signed and Sealed this

Tenth Day of June, 2003

JAMES E. ROGAN
*Director of the United States Patent and Trademark Office*